(12) United States Patent
Yoon et al.

(10) Patent No.: US 11,249,567 B2
(45) Date of Patent: Feb. 15, 2022

(54) PAD CONNECTION STRUCTURE AND TOUCH SENSOR INCLUDING THE SAME

(71) Applicant: DONGWOO FINE-CHEM CO., LTD., Jeollabuk-do (KR)

(72) Inventors: Ju In Yoon, Gyeonggi-do (KR); Jae Hyun Lee, Gyeonggi-do (KR); Keon Kim, Gyeonggi-do (KR)

(73) Assignee: DONGWOO FINE-CHEM CO., LTD., Jeollabuk-Do (KR)

( * ) Notice: Subject to any disclaimer, the term of this patent is extended or adjusted under 35 U.S.C. 154(b) by 0 days.

(21) Appl. No.: 16/204,186

(22) Filed: Nov. 29, 2018

(65) Prior Publication Data

US 2019/0179437 A1    Jun. 13, 2019

(30) Foreign Application Priority Data

Dec. 12, 2017 (KR) .................. 10-2017-0170663

(51) Int. Cl.
| | | |
|---|---|---|
| *G06F 3/0354* | (2013.01) | |
| *G06F 3/041* | (2006.01) | |
| *H05K 1/11* | (2006.01) | |
| *G06F 3/044* | (2006.01) | |

(52) U.S. Cl.
CPC ........ *G06F 3/03547* (2013.01); *G06F 3/0412* (2013.01); *G06F 3/0443* (2019.05); *G06F 3/0446* (2019.05); *G06F 3/04164* (2019.05); *H05K 1/111* (2013.01); *H05K 1/118* (2013.01); *G06F 2203/04111* (2013.01)

(58) Field of Classification Search
CPC ............... G06F 3/03547; G06F 3/0446; G06F 3/04164; G06F 3/0443; G06F 3/0412; G06F 2203/04111; H05K 1/111; H05K 1/118

See application file for complete search history.

(56) References Cited

U.S. PATENT DOCUMENTS

| | | | | |
|---|---|---|---|---|
| 2002/0145694 A1* | 10/2002 | Jang | ..................... | G02F 1/13458 349/138 |
| 2009/0236151 A1* | 9/2009 | Yeh | ......................... | G06F 3/0443 178/18.03 |
| 2010/0182275 A1* | 7/2010 | Saitou | .................... | G06F 3/0446 345/174 |
| 2011/0227858 A1* | 9/2011 | An | ......................... | G06F 3/0446 345/174 |
| 2012/0075243 A1* | 3/2012 | Doi | ......................... | G06F 3/0445 345/174 |

(Continued)

FOREIGN PATENT DOCUMENTS

| | | |
|---|---|---|
| KR | 10-2012-0119368 A | 10/2012 |
| KR | 10-2013-0021871 A | 3/2013 |

(Continued)

*Primary Examiner* — Amare Mengistu
*Assistant Examiner* — Jennifer L Zubajlo
(74) *Attorney, Agent, or Firm* — The PL Law Group, PLLC

(57) ABSTRACT

A pad connection structure includes a substrate, a lower insulation layer formed on a top surface of the substrate, a pad electrode disposed on the lower insulation layer, and an upper insulation layer including an opening through which a top surface of the pad electrode. A step height via the opening is reduced by the lower insulation layer so that connecting reliability with a conductive connection structure is improved.

14 Claims, 3 Drawing Sheets

(56) References Cited

U.S. PATENT DOCUMENTS

| | | | |
|---|---|---|---|
| 2015/0035777 A1* | 2/2015 | Hirakata | G06F 3/0412 |
| | | | 345/173 |
| 2015/0070305 A1* | 3/2015 | Seo | G06F 3/0446 |
| | | | 345/174 |
| 2015/0162388 A1* | 6/2015 | Kim | G06F 1/1626 |
| | | | 257/40 |
| 2017/0115800 A1* | 4/2017 | Lee | G06F 3/0446 |
| 2017/0256593 A1* | 9/2017 | Jung | G06F 3/0412 |
| 2018/0166526 A1* | 6/2018 | Kim | G06F 3/03547 |
| 2019/0129535 A1* | 5/2019 | Choi | G06F 3/044 |

FOREIGN PATENT DOCUMENTS

| | | |
|---|---|---|
| KR | 10-2016-0070591 A | 6/2016 |
| KR | 10-2017-0104013 A | 9/2017 |
| KR | 10-2017-0112029 A | 10/2017 |

\* cited by examiner

PAD CONNECTION STRUCTURE AND TOUCH SENSOR INCLUDING THE SAME

CROSS-REFERENCE TO RELATED APPLICATION AND CLAIM OF PRIORITY

This application claims priority to Korean Patent Applications No. 10-2017-0170663 filed on Dec. 12, 2017 in the Korean Intellectual Property Office (KIPO), the entire disclosure of which is incorporated by reference herein.

BACKGROUND

1. Field

The present invention relates to a pad connection structure and a touch sensor including the same. More particularly, the present invention relates to a pad connection structure including an insulation layer and a conductive pattern, and a touch sensor including the same.

2. Description of the Related Art

As information technologies are being developed, various demands in display devices having thinner dimension, light-weight, high efficiency in power consumption, etc., are increasing. The display device may include a flat panel display device such as a liquid crystal display (LCD) device, a plasma display panel (PDP) device, an electro-luminescent display device, an organic light emitting diode (OLED) display device, etc.

A touch panel or a touch sensor capable of inputting a user's direction by selecting an instruction displayed in a screen with a finger or a tool is also developed. The touch panel or the touch sensor may be combined with the display device so that display and information input functions may be implemented in one electronic device.

As a resolution of the display device become increased to a QHD (Quad High Definition) level or a UHD (Ultra High Definition) level, a high resolution is also required in the touch sensor. Thus, the number of sensing electrodes or channels included in the touch sensor is increasing, and a width or a pitch of a pad for connecting the channel with an external circuit is decreasing.

However, when the width or the pitch of the pad decreases, an electrical connection reliability via the pad may be degraded and electrical connection resistance through the external circuit may be increased. Further, a mechanical connection failure may be also caused.

For example, Korean Published Patent Publication No. 2016-0070591 discloses a touch sensor including an electrode wiring, and fails to provide solutions for sufficiently achieving the electrical connection reliability in a high resolution touch sensor including a minute pad.

SUMMARY

According to an aspect of the present invention, there is provided a pad connection structure having improved connecting reliability and electrical properties.

According to an aspect of the present invention, there is provided a touch sensor including the pad connection structure.

According to an aspect of the present invention, there is provided an image display device with high resolution including the pad connection structure or the touch sensor.

The above aspects of the present inventive concepts will be achieved by the following features or constructions:

(1) A pad connection structure comprising a substrate; a lower insulation layer formed on a top surface of the substrate; a pad electrode disposed on the lower insulation layer; and an upper insulation layer including an opening through which a top surface of the pad electrode is exposed.

(2) The pad connection structure according to the above (1), wherein the lower insulation layer includes a plurality of lower insulation patterns isolated from each other, and the pad electrode is disposed on each of the lower insulation pattern.

(3) The pad connection structure according to the above (2), wherein the lower insulation pattern includes a sidewall inclined by a predetermined acute angle with respect to the top surface of the substrate.

(4) The pad connection structure according to the above (3), wherein the pad electrode entirely covers the lower insulation pattern, and includes an inclined sidewall having a shape corresponding to that of the lower insulation pattern.

(5) The pad connection structure according to the above (3), wherein the upper insulation layer includes a protrusion at an overlapping region with the sidewall of the lower insulation pattern.

(6) The pad connection structure according to the above (5), wherein an upper periphery of the opening is defined by the protrusion.

(7) The pad connection structure according to the above (1), further comprising a conductive connection structure electrically connected to the pad electrode via the opening.

(8) The pad connection structure according to the above (7), wherein the conductive connection structure includes an anisotropic conductive film contacting the pad electrode via the opening.

(9) The pad connection structure according to the above (8), wherein the conductive connection structure further includes a flexible printed circuit board adhered to the anisotropic conductive film.

(10) The pad connection structure according to the above (1), wherein the upper insulation layer partially overlaps the lower insulation layer, and a step height between top surfaces of the upper insulation layer and the pad electrode is 50% or less of a height of the upper insulation layer.

(11) A touch sensor, comprising a substrate including a sensing region and a pad connection region; sensing electrodes arranged on the sensing region of the substrate; a pad connection structure disposed on the pad connection region of the substrate, wherein the pad connection structure includes a lower insulation layer formed on a top surface of the substrate, a pad electrode disposed on the lower insulation layer; and an upper insulation layer including an opening through which a top surface of the pad electrode is exposed; and traces connecting the sensing electrodes to the pad electrode of the pad connection structure.

(12) The touch sensor according to the above (11), wherein the sensing electrodes include first sensing electrodes and second sensing electrodes which are arranged along two directions crossing each other.

(13) The touch sensor according to the above (12), further comprising an insulation layer at least partially covering the first sensing electrodes; and a bridge electrode disposed on the insulation layer to connect the second sensing electrodes neighboring each other.

(14) The touch sensor according to the above (13), wherein the lower insulation layer includes the same material as that of the insulation layer, and the pad electrode includes the same material as that of the sensing electrodes or the bridge electrode.

(15) The touch sensor according to the above (11), wherein the upper insulation layer covers the sensing electrodes on the sensing region.

According to exemplary embodiments of the present invention, the pad connection structure may include a lower insulation layer formed between a substrate and a pad electrode, and an upper insulation layer including an opening through which the pad electrode may be exposed. A height of the pad electrode may be increased by the lower insulation layer so that a step between the upper insulation layer and the pad electrode may be reduced. Thus, an adhesion of a conductive connection structure that may be connected to the pad electrode via the opening may be enhanced, and resistance increase due to a contact failure may be prevented.

In some embodiments, the lower insulation layer and the pad electrode may be formed by a process substantially the same as that for structures in a sensing region of a touch sensor. Accordingly, connection reliability may be improved without an additional process.

DETAILED DESCRIPTION

According to exemplary embodiments of the present invention, a pad connection structure and a touch sensor including the pad connection structure are provided. The pad connection structure may include a substrate, a lower insulation layer, a pad electrode and an upper insulation sequentially on a substrate. The upper insulation layer may include an opening through which the pad electrode is exposed. A connection reliability of a conductive connection structure via the pad electrode may be improved by the lower insulation layer.

Hereinafter, the present invention will be described in detail with reference to the accompanying drawings. However, those skilled in the art will appreciate that such embodiments described with reference to the accompanying drawings are provided to further understand the spirit of the present invention and do not limit subject matters to be protected as disclosed in the detailed description and appended claims.

Figure 1:
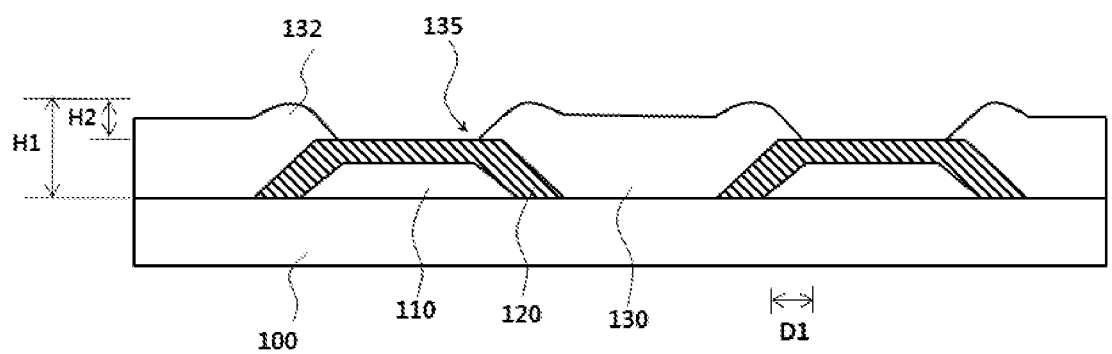
FIG. 1 is a schematic cross-sectional view illustrating a pad connection structure in accordance with exemplary embodiments.

FIG. 1 is a schematic cross-sectional view illustrating a pad connection structure in accordance with exemplary embodiments Referring to FIG. 1, the pad connection structure may include a substrate 100, a lower insulation layer 110, a pad electrode 120 and an upper insulation layer 130.

The substrate 100 may include a film-type substrate that may serve as a base layer for forming the pad electrode 120 and/or a touch sensor (see FIGS. 4 and 5), or an object or a workpiece on which the pad connection structure or the touch sensor are formed. In some embodiments, the substrate 100 may include a display panel on which the pad connection structure or the touch sensor is formed.

For example, the substrate 100 may include a substrate or a film material commonly used in the touch sensor. For example, the substrate 100 may include glass, polymer and/or an inorganic insulation material. The polymer may include, e.g., cyclo olefin polymer (COP), polyethylene terephthalate (PET), polyacrylate (PAR), polyether imide (PEI), polyethylene naphthalate (PEN), polyphenylene sulfide (PPS), polyallylate (polyallylate), polyimide (PI), cellulose acetate propionate (CAP), polyether sulfone (PES), cellulose triacetate (TAC), polycarbonate (PC), cyclo olefin copolymer (COC), polymethylmethacrylate (PMMA), etc. The inorganic insulation material may include, e.g., silicon oxide, silicon nitride, silicon oxynitride, a metal oxide, etc.

The lower insulation layer 110 may be formed on a top surface of the substrate 100. In exemplary embodiments, the lower insulation layer 110 may be in contact with the top surface of the substrate 100, and may include a plurality of lower insulation patterns isolated from each other. Hereinafter, the lower insulation pattern and the lower insulation layer may be described using the same reference numeral.

As illustrated in FIG. 1, a sidewall of the lower insulation pattern 110 may be tapered or inclined with a predetermined acute angle to the top surface of the substrate 100. For example, the lower insulation pattern 110 may have a trapezoidal cross-section.

The lower insulation pattern 110 may be formed of an organic insulation material such as an acryl-based resin, an epoxy-based resin, a urethane-based resin or a siloxane-based resin, etc. In this case, a resin composition may be coated on the top surface of the substrate 100 by a printing process or a coating process such as an inkjet printing, a nozzle printing, a spin coating, a slit coating, etc., to form a coating layer, and a curing process may be performed to form the lower insulation pattern 110.

In some embodiments, the coating layer may be patterned by exposure and developing processes to form the lower insulation pattern 110 as illustrated in FIG. 1.

In an embodiment, the lower insulation pattern 110 may be formed of an inorganic insulation material such as silicon oxide, silicon oxynitride, silicon nitride, etc. In this case, the inorganic insulation material may be deposited on the top surface of the substrate 100 by, e.g., a chemical vapor deposition (CVD) process, a physical vapor deposition (PVD) process, or the like, and then a dry or wet etching process may be performed to form the lower insulation pattern 110.

As illustrated in FIG. 1, a sidewall of the lower insulation pattern 110 may have a substantially linear shape. In some embodiments, the sidewall may have a curved profile such as a concave shape or a convex shape.

The pad electrode 120 may be formed on the lower insulation pattern 110. In some embodiments, the pad electrode 120 may cover a top surface and the sidewall of the lower insulation pattern 110 on the top surface of the substrate 100. In this case, the pad electrode 120 may be in contact with the top surface of the substrate 100. The pad electrode 110 may have a top surface and a sidewall including profiles substantially the same as or similar to those of the lower insulation pattern 110.

The pad electrode 120 may include a metal, an alloy, a metal wither or a transparent conductive oxide. For example, the pad electrode 120 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn) or an alloy thereof (e.g., silver-palladium-copper (APC)). These may be used alone or in a combination thereof.

In some embodiments, the pad electrode 120 may include the transparent conductive oxide such as indium tin oxide (ITO), indium zinc oxide (IZO), zinc oxide (ZnO), indium zinc tin oxide (IZTO), cadmium tin oxide (CTO), etc.

In an embodiment, the pad electrode 120 may have a multi-layered structure including a metal layer and a transparent conductive oxide layer.

The upper insulation layer 130 may be formed on the top surface of the substrate 100 and may partially cover the pad electrode 120. In exemplary embodiments, the upper insulation layer 130 may include an opening 135 through which a top surface of the pad electrode 120 may be at least partially exposed.

The upper insulation layer 130 may be formed by a process and a material substantially the same as or similar to those for the lower insulation layer or the lower insulation pattern 110. For example, the organic insulation material or the inorganic insulation material nay be coated or printed to form the upper insulation layer 130. In some embodiments, the opening 135 may be formed by a patterning process such as a developing process or an etching process.

The upper insulation layer 130 may include a protrusion 132 at an overlapping region with the pad electrode 120 and the lower insulation pattern 110. For example, the upper insulation layer 130 may be formed on inclined sidewalls of the pad electrode 120 and the lower insulation pattern 110 to form the protrusion 132. In some embodiments, the protrusion 132 may be formed along an upper periphery of the opening 135.

According to exemplary embodiments as described above, the lower insulation layer or the lower insulation pattern 110 may be formed on the substrate 100 before forming the pad electrode 120 so that a height of the pad electrode 120 exposed through the opening 135 may be increased. Thus, a step height H2 between the upper insulation layer 130 and the pad electrode 120 may be reduced. For example, the step height H2 may be defined as a distance between top surfaces of the protrusion 132 and the pad electrode 120.

Therefore, when a connection or bonding process for connecting a conductive connection structure (see FIG. 3) and the pad electrode 120 is performed, an adhesion failure and an increase of a contact resistance due to a stepped portion may be prevented and the pad connection structure having high reliability may be achieved.

In some embodiments, an overlapping width D1 of the upper insulation layer 130 and the lower insulation pattern 110 may be about 7 μm or less, preferably about 5 μm or less. If the overlapping width D1 becomes excessively larger, the protrusion 132 may be expanded and a planarity of the upper insulation layer 130 may be degraded to cause a bonding failure of the conductive connection structure.

In some embodiments, the step height H2 may be about 50% or less of a height of the upper insulation layer H1. Thus, the connection failure of the conductive connection structure due to the stepped portion between the pad electrode 120 and the upper insulation layer 130 may be avoided or significantly reduced.

Figure 2:
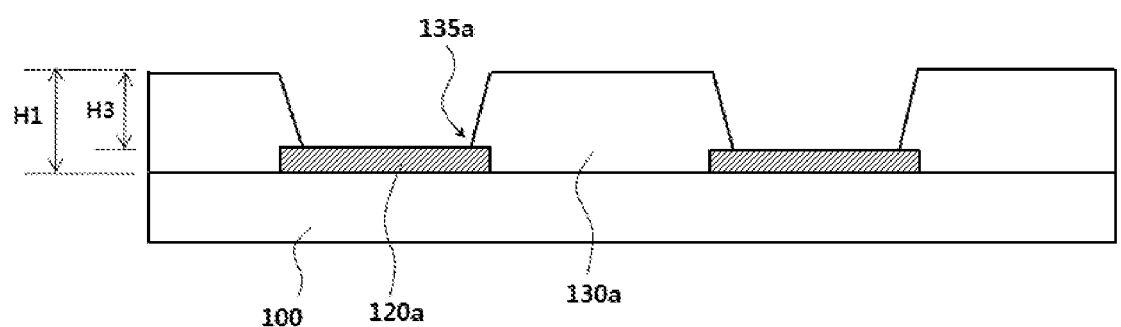
FIG. 2 is a schematic cross-sectional view illustrating a pad connection structure in accordance with a comparative example.

FIG. 2 is a schematic cross-sectional view illustrating a pad connection structure in accordance with a comparative example.

Referring to FIG. 2, the pad connection structure of the comparative example may include a substrate 100, a pad electrode 120a and an upper insulation layer 130a.

In the comparative example, the pad electrode 120a may be formed directly on a top surface of the substrate 100, and the upper insulation layer 130a including an opening 135a through which a top surface of the pad electrode 120 is exposed may be formed on the top surface of the substrate 100.

In this case, the upper insulation layer 130a may have a predetermined height H1 to cover, e.g., sensing electrodes of a touch sensor. Accordingly, a step height H3 between the top surfaces of the upper insulation layer 130a and the pad electrode 120a may be increased. Thus, a height of the opening 135a for connecting a conductive connection structure may be also increased to cause a connection failure and a resistance increase due to insufficient adhesion with the conductive connection structure.

However, according to exemplary embodiments as described above, the lower insulation pattern 110 or the lower insulation layer may be disposed under the pad electrode 110 to reduce the step height H2 so that the connection reliability with the conductive connection structure may be enhanced.

Figure 3:
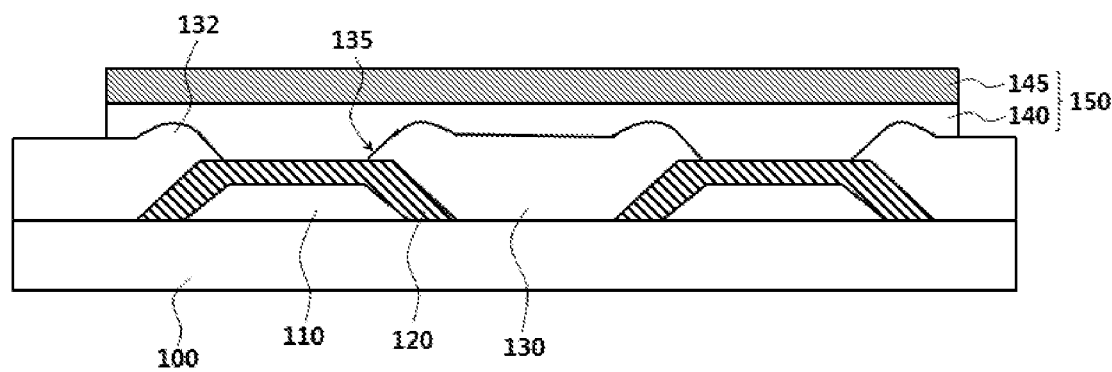
FIG. 3 is a schematic cross-sectional view illustrating a pad connection structure in accordance with a comparative example.

FIG. 3 is a schematic cross-sectional view illustrating a pad connection structure in accordance with a comparative example. For example, FIG. 3 illustrates a connection between a pad electrode and the conductive connection structure.

Referring to FIG. 3, a conductive connection structure 150 may be electrically connected to the pad electrode 120 through the opening 135 on the upper insulation layer 130.

In exemplary embodiments, the conductive connection structure 150 may include an anisotropic conductive film (ACF) 140 and a flexible printed circuit board (FPCB) 150. The ACF 140 may be adhered to the upper insulation layer 130 and may fill the opening 135 to be in contact with an exposed surface of the pad electrode 120.

As described above, a height of the pad electrode 120 may be increased by the lower insulation pattern 110, and a step height between the pad electrode and the upper insulation layer 130 may be reduced. Thus, a filling amount in the opening 135 may be reduced, and an adhesion between the pad electrode 120 and the ACF 140 may be improved. Further, the ACF 140 may be adhered to an entire exposed surface of the pad electrode 120 without generating a void in the opening 135 so that a contact resistance may be reduced and an electrical connection reliability may be improved.

Additionally, the upper insulation layer 130 may include the protrusion 132 formed by the inclined sidewalls of the lower insulation pattern 110 and/or the pad electrode 120. A contact area between the ACF 140 and the upper insulation layer 130 may be increased by the protrusion 132 so that the adhesion of the ACF 140 may be further enhanced. Thus, a delamination of the ACF 140 by an external shock may be prevented.

The FPCB 145 may be attached on the ACF 140 to be electrically connected to the pad electrode 110. The FPCB 145 may convert a capacitance change created from sensing electrodes of a touch sensor into an electrical signal to be transferred to a driving IC.

As illustrated in FIG. 3, the ACF 140 may be commonly bonded to a plurality of the pad electrodes 110. Alternatively, the ACF 140 may be individually bonded to each pad electrode 110.

For convenience of descriptions, FIG. 3 illustrates that the ACF 140 completely fills the opening 135 and has a planarized top surface. However, in an embodiment, the ACF 140 may be formed conformably along profiles of the upper insulation layer 130 and the opening 135.

Figure 4:
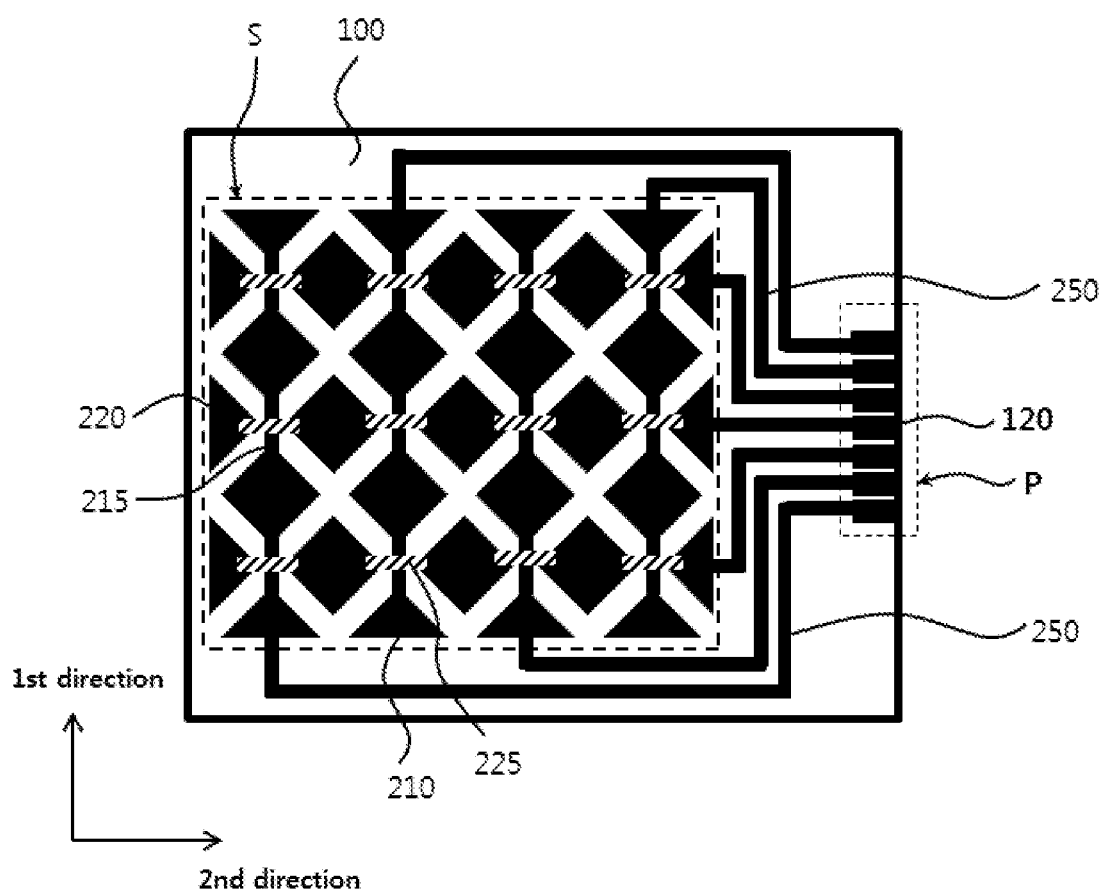
FIGS. 4 and 5 are a top plane view and a cross-sectional view, respectively, illustrating a touch sensor in accordance with exemplary embodiments.
Figure 5:
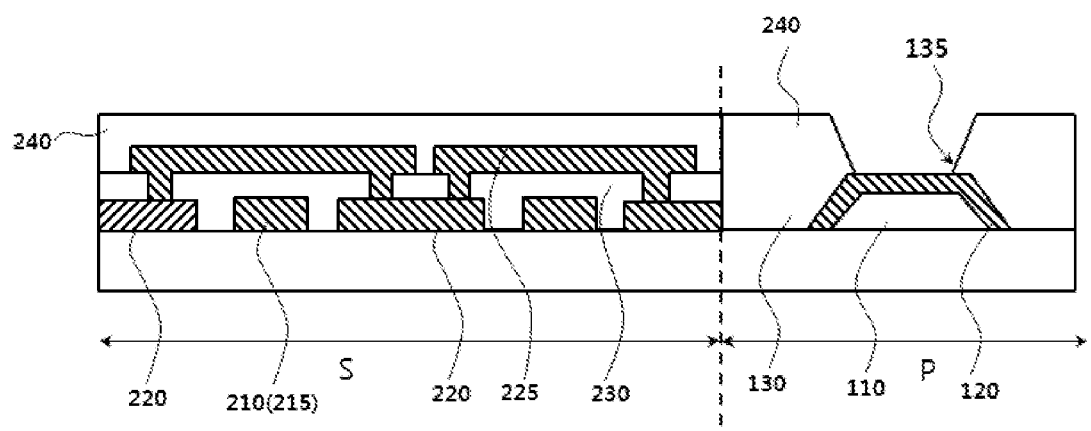

FIGS. 4 and 5 are a top plane view and a cross-sectional view, respectively, illustrating a touch sensor in accordance with exemplary embodiments.

In FIG. 4, two directions being parallel to a top surface of a substrate 100 and perpendicular to each other are defined as a first direction and a second direction. For example, the first direction corresponds to a length direction of the touch sensor and the second direction corresponds to a width direction of the touch sensor.

For example, FIG. 5 includes a partial cross-sectional view along the first direction in a sensing region S and a partial cross-sectional view along the second direction in a pad connection region P.

Referring to FIGS. 4 and 5, the touch sensor may include sensing electrodes 210 and 220, traces 250 and pad electrodes 120 formed on the substrate 100. The touch sensor may include the sensing region S and a peripheral region around the sensing region S. Accordingly, a top surface of the substrate 100 may be divided into the sensing region S and the peripheral region.

The sensing electrodes 210 and 220 may be arranged on the sensing region S of the substrate 100. In exemplary embodiments, the sensing electrodes 210 and 220 may include first sensing electrodes 210 and second sensing electrodes 220.

The first sensing electrodes 210 may be arranged along the second direction (e.g., a width direction). Accordingly, a first sensing electrode row extending in the second direction may be formed by the first sensing electrodes 210. Further, a plurality of the first sensing electrode rows may be arranged along the first direction.

In some embodiments, the first sensing electrodes 210 neighboring in the second direction may be physically and electrically connected by a connecting portion 215. For example, the connecting portion 215 may be integrally formed with the first sensing electrodes 210 at the same level.

The second sensing electrodes 220 may be arranged along the first direction (e.g., a length direction). In some embodiments, the second sensing electrodes 220 may include island-type unit electrodes physically separated from each other. In this case, the second sensing electrodes 220 neighboring in the first direction may be electrically connected to each other by a bridge electrode 225.

Accordingly, a second sensing electrode column extending in the first direction may be formed by a plurality of the second sensing electrodes 220 and the bridge electrodes 225. Further, a plurality of the second sensing electrode columns may be arranged along the second direction.

The sensing electrodes 210 and 220, and/or the bridge electrode 225 may include a metal, an alloy, a metal wire or a transparent conductive oxide.

For example, the sensing electrodes 210 and 220, and/or the bridge electrode 225 may include silver (Ag), gold (Au), copper (Cu), aluminum (Al), platinum (Pt), palladium (Pd), chromium (Cr), titanium (Ti), tungsten (W), niobium (Nb), tantalum (Ta), vanadium (V), iron (Fe), manganese (Mn), cobalt (Co), nickel (Ni), zinc (Zn), tin (Sn) or an alloy thereof (e.g., silver-palladium-copper (APC)). These may be used alone or in a combination thereof.

The sensing electrodes 210 and 220, and/or the bridge electrode 225 may include the transparent conductive oxide such as indium tin oxide (ITO), indium zinc oxide (IZO), zinc oxide (ZnO), indium zinc tin oxide (IZTO), cadmium tin oxide (CTO), etc.

In some embodiments, the sensing electrodes 210 and 220, and/or the bridge electrode 225 may include a stack structure including the transparent conductive oxide and the metal. For example, the sensing electrodes 210 and 220, and/or the bridge electrode 225 may have a triple-layered structure including a transparent conductive oxide layer-a metal layer-a transparent conductive oxide layer. In this case, a flexible property may be enhanced by the metal layer, and a resistance may be reduced to increase a signal transfer speed. Further, an anti-corrosion property and a transmittance may be improved by the transparent conductive oxide layer.

As illustrated in FIG. 5, the bridge electrode 225 may be formed on an insulation layer 230. The insulation layer 230 may at least partially cover the connecting portion 215 included in the first sensing electrode 210, and may at least partially cover portions of the second sensing electrodes 220 around the connection portion 215. The bridge electrode 225 may be formed through the insulation layer 230, and may be electrically connected to the second sensing electrodes 220 neighboring each other with respect to the connecting portion 215.

The insulation layer 230 may include an inorganic insulation material such as silicon oxide, silicon nitride, etc., or an organic insulation material such as an acryl-based resin, a siloxane-based resin, etc.

The traces 250 may be arranged on the peripheral region of the substrate 100. The traces 250 may be diverged from each of the first sensing electrode row and the second sensing electrode column to extend on the peripheral region.

In exemplary embodiments, one end portion of the peripheral region may serve as the pad connection region P. The traces 250 may be collected in the pad connection region P to be connected or merged with each pad electrode 120.

The pad connection structure as described with reference to FIG. 1 or FIG. 3 may be disposed on the pad connection region P. The pad electrode 120 may be formed on the lower insulation layer or the lower insulation pattern 110 formed on the top surface of the substrate 100 in the pad connection region P.

An upper insulation layer 240 including an opening 135 through which a top surface of the pad electrode 120 may be exposed may be formed on the pad electrode 120. In some embodiments, the upper insulation layer may also extend on the sensing region S to serve as a passivation layer covering the sensing electrodes 210 and 220, and the bridge electrode 225.

As described with reference to FIG. 3, a conductive connection structure including, e.g., an anisotropic conductive film and a flexible printed circuit board may be electrically connected to the pad electrode 120 via the opening 135 on the pad connection region P. As described above, a step height between the pad electrode 120 and the upper insulation layer 240 may be reduced by the lower insulation pattern 110 so that a connection reliability of the conductive connection structure may be improved.

In some embodiments, the lower insulation pattern 110 on the pad connection region P may be formed using a process and a material substantially the same as those of the insulation layer 230 on the sensing region S. In some embodiments, the pad electrode 120 may be formed using a process and a material substantially the same as those of the bridge electrode 225. In this case, the pad connection structure may be formed using a process and a material for forming a sensing structure on the sensing region S so that process efficiency and productivity may be enhanced.

In some embodiments, the lower insulation layer or the lower insulation pattern 110 may be formed on the pad connection region P in advance to forming the sensing electrodes 210 and 220. In this case, the pad electrode 120 may be patterned by a process substantially the same as that for the sensing electrodes 210 and 220.

The touch sensor illustrated in FIGS. 4 and 5 may be, e.g., a mutual capacitance type touch sensor.

In some embodiments, the pad connection structure may be applied to a self-capacitance type touch sensor. For example, sensing electrodes each of which has an island pattern shape may be arranged on the sensing region of the substrate, and a trace may extend from each sensing electrode to be connected to the pad connection structure on the pad connection region.

According to exemplary embodiments, an image display device including the pad connection structure and the touch sensor is also provided.

The image display device may include a display panel of a liquid crystal display (LCD) device, a plasma display panel (PDP) device, an electro luminescent display device, an organic light-emitting diode (OLED) display device, etc.

The touch sensor according to exemplary embodiments may be disposed between the display panel and a window of the image display device. A conductive connection structure including a flexible printed circuit board may be connected to the pad connection structure included in the touch sensor, and may be bent toward the display panel to be connected to, e.g., a main board of the image display device.

For example, the touch sensor may be applied to a touch sensor layer or a touch panel of a flexible display device so that an image display device of high resolution may be achieved.

What is claimed is:

1. A pad connection structure, comprising:
   a substrate including a sensing region and a pad connection region;
   a lower insulation layer formed only on a top surface of the pad connection region of the substrate and including a plurality of lower insulation patterns isolated from each other;
   a pad electrode disposed on each of the lower insulation patterns and entirely covering each of the lower insulation patterns; and
   an upper insulation layer partially covering a top surface of the pad electrode and including an opening through which a top surface of the pad electrode is exposed.

2. The pad connection structure according to claim 1, wherein the lower insulation pattern includes a sidewall inclined by a predetermined acute angle with respect to the top surface of the substrate.

3. The pad connection structure according to claim 2, wherein the pad electrode includes an inclined sidewall having a shape corresponding to that of the lower insulation pattern.

4. The pad connection structure according to claim 2, wherein the upper insulation layer includes a protrusion at an overlapping region with the sidewall of the lower insulation pattern.

5. The pad connection structure according to claim 4, wherein an upper periphery of the opening is defined by the protrusion.

6. The pad connection structure according to claim 1, further comprising a conductive connection structure electrically connected to the pad electrode via the opening.

7. The pad connection structure according to claim 6, wherein the conductive connection structure includes an anisotropic conductive film contacting the pad electrode via the opening.

8. The pad connection structure according to claim 7, wherein the conductive connection structure further includes a flexible printed circuit board adhered to the anisotropic conductive film.

9. The pad connection structure according to claim 1, wherein the upper insulation layer partially overlaps the lower insulation layer, and
   a step height between top surfaces of the upper insulation layer and the pad electrode is 50% or less of a height of the upper insulation layer.

10. A touch sensor, comprising:
    a substrate including a sensing region and a pad connection region;
    sensing electrodes arranged on the sensing region of the substrate;
    a pad connection structure disposed on the pad connection region of the substrate, wherein the pad connection structure includes:
       a lower insulation layer formed only on a top surface of the pad connection region of the substrate and including a plurality of lower insulation patterns isolated from each other;
       a pad electrode disposed on each of the lower insulation patterns and entirely covering each of the lower insulation patterns; and
       an upper insulation layer partially covering a top surface of the pad electrode and including an opening through which a top surface of the pad electrode is exposed; and
    traces connecting the sensing electrodes to the pad electrode of the pad connection structure.

11. The touch sensor according to claim 10, wherein the sensing electrodes include first sensing electrodes and second sensing electrodes which are arranged along two directions crossing each other.

12. The touch sensor according to claim 11, further comprising:
    an insulation layer at least partially covering the first sensing electrodes; and
    a bridge electrode disposed on the insulation layer to connect the second sensing electrodes neighboring each other.

13. The touch sensor according to claim 12, wherein the lower insulation layer includes the same material as that of the insulation layer, and
    the pad electrode includes the same material as that of the sensing electrodes or the bridge electrode.

14. The touch sensor according to claim 10, wherein the upper insulation layer covers the sensing electrodes on the sensing region.

* * * * *